(12) United States Patent
Ong et al.

(10) Patent No.: US 7,991,572 B2
(45) Date of Patent: Aug. 2, 2011

(54) DELAY LOCK LOOP DELAY ADJUSTING METHOD AND APPARATUS

(75) Inventors: Adrian E. Ong, San Jose, CA (US); Douglas W. Gorgen, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 12/730,795

(22) Filed: Mar. 24, 2010

(65) Prior Publication Data

US 2010/0228514 A1 Sep. 9, 2010

Related U.S. Application Data

(63) Continuation of application No. 11/853,006, filed on Sep. 10, 2007, now Pat. No. 7,706,998, which is a continuation of application No. 11/480,234, filed on Jun. 30, 2006, now Pat. No. 7,269,524.

(51) Int. Cl.
G06F 19/00 (2006.01)

(52) U.S. Cl. ........ 702/106; 327/158; 327/276; 365/200; 365/201; 365/194; 365/189.12; 375/371; 375/376

(58) Field of Classification Search ............. 702/69, 702/106, 107; 714/744, 745, 814, 815; 326/93; 327/116, 156, 145, 158, 161, 141, 263, 149, 327/293; 365/200, 189.08, 194; 375/371, 375/373, 376

See application file for complete search history.

(56) References Cited

U.S. PATENT DOCUMENTS

| | | | |
|---|---|---|---|
| 6,085,345 A | 7/2000 | Taylor | |
| 6,160,805 A | 12/2000 | Averbuch | |
| 6,263,463 B1 | 7/2001 | Hashimoto | |
| 6,411,142 B1 * | 6/2002 | Abbasi et al. | 327/156 |
| 6,421,801 B1 | 7/2002 | Maddux | |
| 6,584,591 B1 | 6/2003 | Taylor | |
| 6,604,213 B1 | 8/2003 | Nurser | |
| 6,636,110 B1 | 10/2003 | Ooishi | |
| 6,680,874 B1 * | 1/2004 | Harrison | 365/194 |
| 6,693,449 B1 | 2/2004 | Gorgen | |
| 6,774,687 B2 | 8/2004 | Gomm | |
| 6,842,399 B2 * | 1/2005 | Harrison | 365/189.07 |
| 6,873,939 B1 | 3/2005 | Zerbe | |
| 6,900,685 B2 | 5/2005 | Silvestri | |
| 6,917,228 B2 * | 7/2005 | Cooper | 327/158 |
| 6,999,547 B2 * | 2/2006 | Braceras et al. | 375/371 |
| 7,068,085 B2 | 6/2006 | Gomm | |
| 7,088,156 B2 * | 8/2006 | Kim | 327/149 |
| 7,119,592 B2 * | 10/2006 | Cooper | 327/158 |
| 7,137,048 B2 | 11/2006 | Zerbe | |

(Continued)

OTHER PUBLICATIONS

Non-Final Office with mail date of Aug. 17, 2009 for patent application U.S. Appl. No. 11/538,799 filed on Oct. 4, 2006. 19 pages.

(Continued)

*Primary Examiner* — Carol S Tsai

(74) *Attorney, Agent, or Firm* — Park, Vaughan, Fleming & Dowler LLP

(57) ABSTRACT

Systems and methods for synchronizing communication between devices include using a test circuit to measure a propagation time through a delay circuit. The propagation time is used to determine an initial delay value within a delay lock loop. This delay value is then changed until a preferred delay value, resulting in synchronization, is found. In various embodiments, used of the initial delay value increases the speed, reliability or other beneficial features of the synchronization.

20 Claims, 15 Drawing Sheets

U.S. PATENT DOCUMENTS

| | | |
|---|---|---|
| 7,142,032 B2 | 11/2006 | Silvestri |
| 7,184,329 B2 | 2/2007 | Silvestri |
| 7,239,575 B2 * | 7/2007 | Kim .................... 365/189.05 |
| 7,240,254 B2 | 7/2007 | Ong |
| 7,254,141 B1 | 7/2007 | Ong |
| 7,259,582 B2 | 8/2007 | Ong |
| 7,265,570 B2 | 9/2007 | Ong |
| 7,307,442 B2 | 12/2007 | Ong |
| 7,309,999 B2 | 12/2007 | Ong |
| 7,310,000 B2 | 12/2007 | Ong |
| 7,313,740 B2 | 12/2007 | Ong |
| 7,327,173 B2 * | 2/2008 | Kim ............................ 327/149 |
| 7,358,784 B2 * | 4/2008 | Kim et al. .................... 327/158 |
| 7,365,557 B1 | 4/2008 | Ong |
| 7,370,256 B2 | 5/2008 | Ong |
| 7,404,117 B2 | 7/2008 | Ong |
| 7,444,575 B2 | 10/2008 | Ong |
| 7,446,551 B1 | 11/2008 | Ong |
| 7,466,160 B2 | 12/2008 | Ong |
| 7,593,271 B2 | 9/2009 | Ong |
| 7,673,193 B1 | 3/2010 | Ong |
| 2007/0067687 A1 | 3/2007 | Ong ............................ 714/731 |

OTHER PUBLICATIONS

U.S. Non-Final Office Action with mail date of Sep. 22, 2009 re U.S. Appl. No. 11/552,944 filed on Oct. 25, 2006. 23 pages.

Petition to Withdraw from Issuance and 312 Amendment dated Mar. 23, 2010 re U.S. Appl. No. 11/853,006. 8 pages.

Information Disclosure Statement dated Apr. 16, 2010 re U.S. Appl. No. 11/552,938. 4 pages.

* cited by examiner

DELAY LOCK LOOP DELAY ADJUSTING METHOD AND APPARATUS

CROSS-REFERENCE TO RELATED APPLICATIONS

The present application is a continuation of U.S. application Ser. No. 11/853,006 entitled "Delay Lock Loop Delay Adjusting Method and Apparatus" and filed on 10 Sep. 2007, which is a continuation of U.S. application Ser. No. 11/480,234 entitled "Delay Lock Loop Delay Adjusting Method and Apparatus" and filed on 30 Jun. 2006, (U.S. Pat. No. 7,269,524) both of which are hereby incorporated by reference.

BACKGROUND OF THE INVENTION

1. Field of the Invention

The present invention relates to electronic circuits, and more specifically to adjustment of a delay lock loop.

2. Description of Related Art

Many integrated circuit systems use a clock to synchronize communication between various components of the system. For example, a processor in communication with a device, such as a memory, may use a clock signal to assure that data is made available from the memory at a time when the processor is ready to receive it. However, due to differences in propagation and response times in the processor and memory, there may be time differences between the clock signal as perceived in the processor and the memory. In order to compensate for these differences, a delay may be applied to a copy of the clock signal sent to the memory in order.

The optimum delay depends on various environmental and physical parameters and/or characteristics such as supply voltages, and the structures of the components resulting from production of the components and installation of these components in various packages and/or devices. For example, two integrated circuit systems assembled from the components meeting identical specifications may require different delays and these delays may change over time. Optimum delays are, therefore typically determined by the system components in real time. This determination is sometimes made using a delay lock loop (DLL). A DLL uses a feedback circuit to identify a preferred delay and uses the identified delay to delay an output signal (e.g., memory clock) relative to an input system (e.g., system clock).

A DLL may operate by incrementally increasing a delay until a preferred delay is found. A disadvantage of this approach is that the precision of the preferred delay is dependent on the size of the incremental increase. A greater precession requires a smaller increment. However, a smaller increment results in a longer time before a preferred delay can be found. This may be a problem in some systems. What is needed is an efficient method for more quickly determining the preferred delay for a DLL in a integrated circuit system.

SUMMARY OF THE INVENTION

Various embodiments of the invention include a test circuit in communication with a delay circuit. The test circuit is configured to measure an elapsed time between sending a test signal to the delay circuit and receiving a response signal from the delay circuit. This elapsed time is used as a representation of physical or environmental characteristics of a integrated circuit system and may be used, for example, to facilitate the operation of a DLL.

For example, in various embodiments, a delay value is determined according to the measured elapsed time and this delay value is used by a DLL as an initial delay time in determining a preferred delay time for communication between devices. The initial delay time is a first approximation of the preferred delay time and is incremented (or decremented) until the preferred delay time is found. The use of an initial delay time determined using the measured elapsed time typically reduces the time required to identify the preferred delay time.

Various embodiments of the invention include a system comprising a delay circuit configured to receive a test signal and return a response signal, a test circuit configured to determine a delay value responsive to a time between sending the test signal and receiving the response signal, and a delay lock loop configured to determine an initial value for a delay time according to the delay value and to provide a synchronization between a clock and one or more device signals by changing the delay time from this initial value.

Various embodiments of the invention include a method comprising sending a test signal to a delay circuit and receiving a response signal responsive to the test signal, determining a delay value according to a propagation time between sending the test signal and receiving the response signal, communicating the delay value to a delay lock loop configured to provide a synchronization between a clock signal and one or more device signals, determining a delay time between the clock signal and the one or more device signals, and changing the delay time in the delay lock loop to provide the synchronization between the clock signal and the one or more device signals.

Various embodiments of the invention include a system comprising a test circuit configured to determine a delay value according to the time between sending a test signal and receiving a response signal, a programmable delay circuit configured to receive the delay value and determine a delay time according to the delay value, and a timing controller configured to determine a synchronization between a processor and a device in communication with the processor by changing the delay time.

Various embodiments of the invention include a system comprising a device configured to communicate with a processor, a delay circuit configured to receive a test signal from a controller and return a response signal to the controller, a time between receiving the test signal and sending the response signal being representative of operating characteristics of the device and being configured for determining a synchronization between the processor and the device.

Various embodiments of the invention include a method comprising receiving a test signal, and returning a response signal to a controller configured to determine a delay time according to a time between receiving the test signal and sending the response signal and to determine a synchronization between a processor and a device by changing the delay time.

DETAILED DESCRIPTION

Various embodiments of the invention include a test circuit in communication with a delay locked loop (DLL) and with a delay circuit responsive to physical and environmental characteristics (e.g., temperature, voltage, current, and the like) of an integrated circuit system. In some embodiments, the test circuit is configured to determine a delay value by measuring a propagation time of a signal through the delay circuit. The propagation time may be used as a representation of the physical and environmental parameters and/or characteristics of the delay circuit.

In some embodiments, the delay value is used for synchronization of communication between two electronic circuits. For example, the delay value may be used to synchronize a clock signal of a first device with the receipt of signals from a second device by using the delay value as an initial value for a delay time for the DLL. The delay time may be changed from the initial value until a preferred delay time is found.

In various embodiments, the delay time is represented by an analog signal or digital value in the DLL. As such, changing the delay time includes increasing, or decreasing, the delay time by varying the analog signal or changing a digital value by digital increments. These changes in the delay time may be fixed or variable. Typically, the use of an initial, non-zero, delay time related to physical and/or environmental conditions of the system, reduces the number of attempts that must be made before a preferred (synchronized) delay value is found in comparison with the prior art. This approach, therefore, increases the speed at which synchronization may be accomplished.

Figure 1:
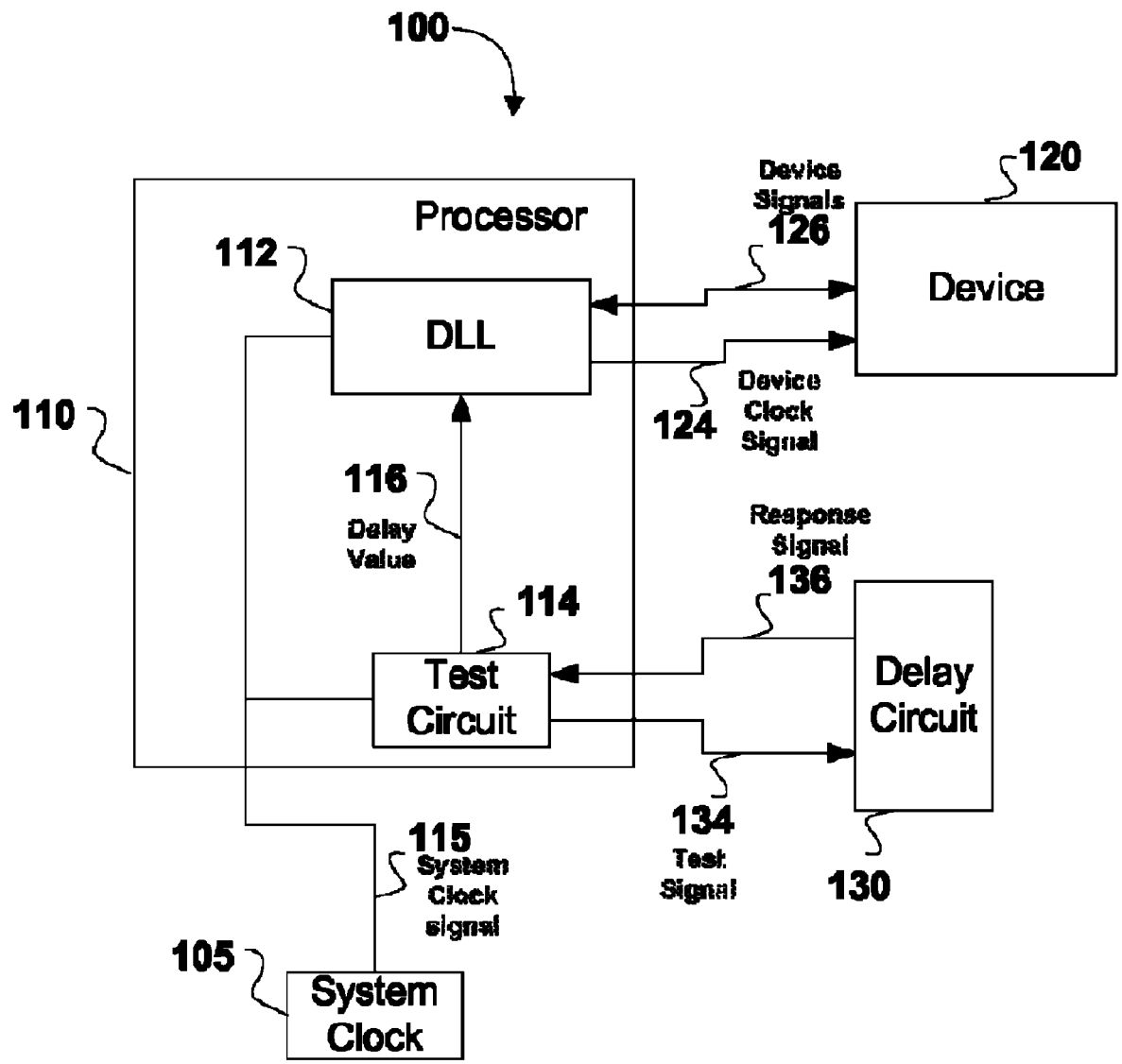
FIG. 1 is a block diagram illustrating an exemplary integrated circuit system, according to various embodiments of the invention.

FIG. 1 is a block diagram illustrating an integrated circuit system generally designated 100, in accordance with various embodiments of the invention. The integrated circuit system 100 includes a processor 110 in communication with a device 120 and a delay circuit 130. A system clock 105 is configured to provide a system clock signal 115 to the processor 110. In various embodiments, the device 120 includes memory, ASICS, peripheral devices, or the like. The delay circuit 130 is optionally included in the device 120 or the processor 110.

In various embodiments, the processor 110 includes a micro-processor, a computer, a peripheral controller, a parallel interface, a serial interface, an analog interface, a universal serial bus (USB) device interface, a disk controller, a digital signal processor (DSP), an audio processor, a server, a central processing unit, a spectrum analyzer, a parallel processing system, a direct memory access device (DMA), an analog to digital converter, a digital to analog converter, a hand held device, a microcomputer, a video interface, a calculator, a personal digital assistant (PDA), a mobile phone, a game processor, a data mobile device, a radio frequency identification (RFID) tag, a vector processor, a bus controller, a memory controller, a reduced instruction set (RISC) processor, a mathematical co-processor, or the like.

The processor 110 includes a DLL 112 and a test circuit 114. The DLL 112 is configured to receive the system clock signal 115 and communicate a device clock signal 124 (e.g., a clock signal having a predetermined delay for a particular device) to the device 120. The device clock signal 124 is delayed by the DLL 112 relative to the system clock signal 115 in order to synchronize communication between the processor 110 and the device 120. For example, the device clock signal 124 may be delayed relative to the system clock signal, by a preferred delay, such that one or more device signals 126 from the device 120 are received by the processor 110 at an appropriate time relative to the system clock signal 115. This synchronization may be bidirectional, e.g., include the synchronization of device signals 126 sent from the processor 110 to the device 120.

The test circuit 114 is configured to receive the system clock signal 115 or make use of an alternative clock signal (not shown). The test circuit 114 is further configured to send a test signal 134 to the delay circuit 130 and receive a response signal 136 from the delay circuit 130. A delay value 116 is determined responsive to the propagation time between sending the test signal 134 and receiving the response signal 136 as measured by the test circuit 114. In some embodiments, the delay value is determined by using the propagation time to look up a value in a lookup table. In some embodiments, the delay value is determined by using the propagation time as in input to an analytical function. The lookup table and/or function may be programmable by storing data in the processor 110. For example, programming may occur by loading values into a register of processor 110 or by activating fuses. The alternative clock signal source can be another clock, or a multiplication of the system clock signal 115.

The DLL 112 may receive the delay value 116 from the test circuit 114 for use as an initial value for a delay time for the device clock signal 124. The DLL 112 is configured to send the device clock signal 124 to the device 120 and receive the one or more device signals 126 from the device 120. The DLL 112 may determine a synchronization between the one or more device signals 126 and the system clock signal 115 by dynamically comparing the timing of the device signals 126 and the system clock signal. The DLL 112 may change the delay time, starting from the initial value of the delay time, until a desired relationship between the device signals 126 and the system clock signal is achieved. The DLL 112 then maintains this relationship. The device signals 126 include data signals, address signals, control signals, a clock signal, or the like.

In various embodiments, the delay circuit 130 includes digital delay lines, digital logic circuits, memory circuits, digital components configured to propagate a signal, analog delay lines, passive analog components configured to propagate a signal, active analog components configured to propagate a signal, or the like. The delay circuit 130 is illustrated in FIG. 1 as a separate circuit, however, in alternative embodiments, the delay circuit 130 may be included in the device 120, the test circuit 114, or the processor 110. The test circuit 114 is illustrated in FIG. 1 as a circuit included in the processor 110, however, in alternative embodiments, the test circuit 114 may be included in the DLL 112, the device 120, the delay circuit 130, or as an independent device. The DLL 112 is illustrated in FIG. 1 as a circuit included in the processor 110, however, in alternative embodiments, the DLL 112 may be included in the device 120.

The test signal 134 and the response signal 136 are illustrated in FIG. 1 as being communicated over separate paths, however, the test signal 134 and the response signal 136 may be communicated on the same conductor or set of conductors. The system clock 105 is illustrated in FIG. 1 as separate from the processor 110, however, in alternative embodiments, the system clock 105 may be included in the processor 110, the test circuit 114, or the DLL 112. In some embodiments, the test circuit 114 includes an internal clock.

Figure 2:
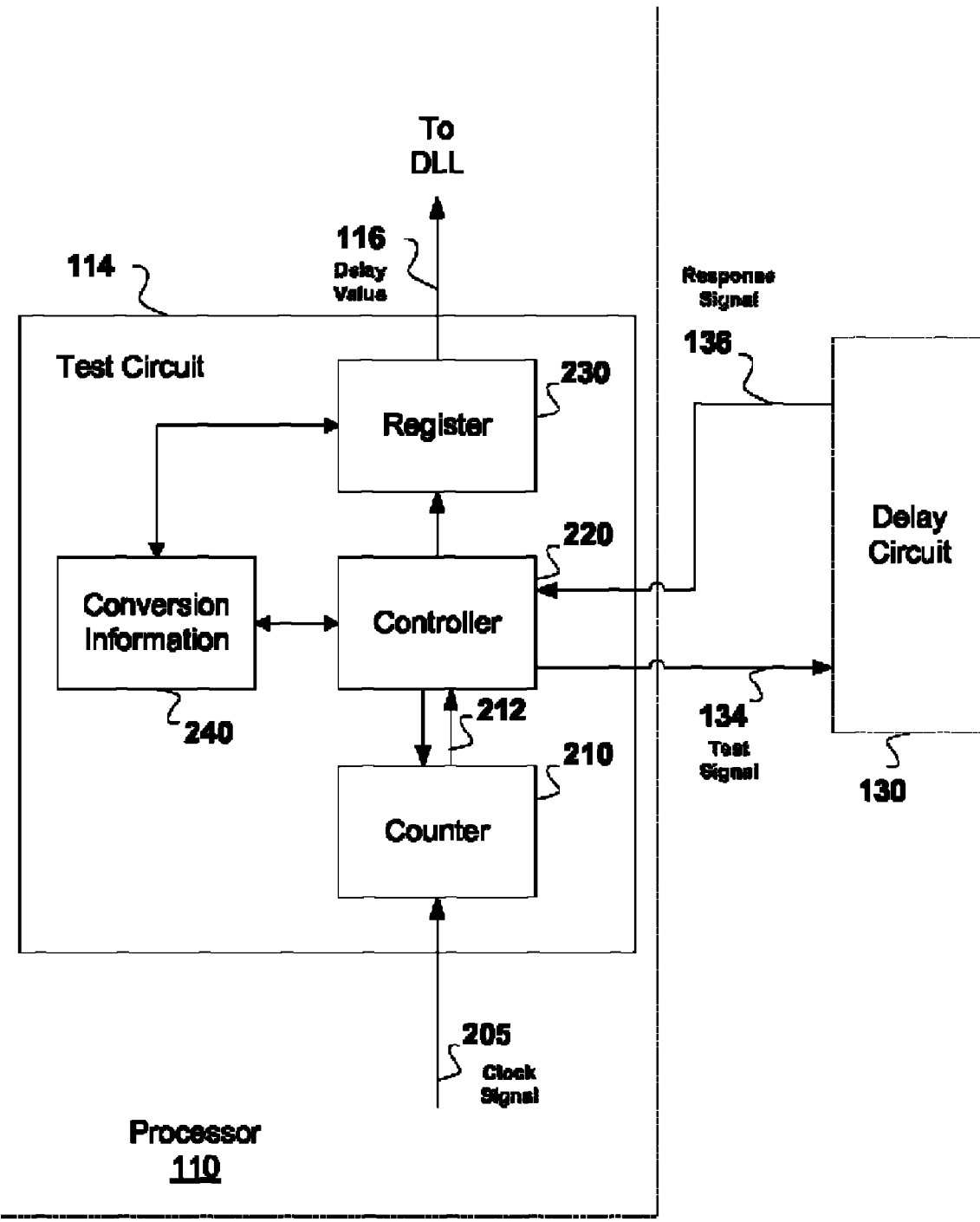
FIG. 2 is a block diagram illustrating details of an exemplary test circuit of FIG. 1, according to various embodiments of the invention.

FIG. 2 is a block diagram illustrating details of the test circuit 114 of FIG. 1, according to various embodiments of the invention. The test circuit 114 includes a counter 210, a controller 220, a register 230, and optional conversional information 240. The counter 210 is configured to receive a clock signal 205 and provide count signals 212 to controller 220. The clock signal 205 may be the system clock signal 115, a derivative of the system clock signal, or a signal generated by a separate clock (not shown). This separate clock is optionally included in the test circuit 114.

The controller 220 sends a test signal 134 to the delay circuit 130 and waits for a response signal 136. The controller 220 uses the count signals 212 received from the counter 210 to determine a propagation delay, measured in counts, between sending the test signal 134 and receiving the response signal 136. The propagation delay may be stored in the register 230, where it can be communicated to the DLL 112. The propagation delay may be determined by subtracting a value received from the counter 210 when the test signal 134 is sent from a value received from the counter 210 when the response signal 136 is received. Alternatively, the controller 220 may be configured to reset the counter 210 when the test signal 134 is sent and to read the value of the counter 210 when the response signal is received, the read value representing the propagation delay. Alternatively, the controller 220 and the counter 210 may be configured to be reset using an external reset signal (illustrated elsewhere herein) when the test signal 134 is sent by the controller 220. In alternative embodiments, the controller 220 may use other methods of measuring the propagation delay.

The conversion of propagation delay to delay value optionally makes use of the conversion information 240. In various embodiments, the conversion information 240 is applied to the propagation delay using the controller 220. Optionally, the conversion information 240 is applied to the propagation delay using the register 230. In various embodiments, the conversion information 240 includes a lookup table configured for converting a number of counts to a delay value, a function configured for converting a number of counts to a delay value, or the like. The conversion information 240 is optionally programmable. In some embodiments, the conversion information 240 may be applied using hardwired logic (illustrated elsewhere herein). In some embodiments, the propagation delay is used as the delay value 116 without conversion.

The delay value 116 is responsive to the time elapsed between the time the test signal 134 was sent by the controller 220 and the time the response signal 136 was received by the controller 220. The delay value 116 may depend on physical characteristics of the delay circuit 130, such as for example, process variation of the delay circuit 130 resulting from production and installation of the delay circuit 130 in the integrated circuit system 100. The delay value 116 may depend on environmental characteristics of the delay circuit 130, for example, the temperature of the delay circuit 130, the supply voltage level applied to the delay circuit 130, and the like. In various embodiments, the delay value 116 may depend on communications parameters, such as properties of the communications between the delay circuit 130 and the test circuit 114. Examples of such properties include the conductor resistance, capacitance, and/or inductance for conductor paths communicating the test signal 134 and the response signal 136. The delay value 116 may depend on a combination of the physical characteristics, the environmental characteristics, and the communications parameters.

It may be appreciated by those skilled in the electronics arts that there are a variety of methods for measuring the time elapsed between sending the test signal 134 and receiving the response signal 136, including digital, analog, mechanical, and the like. For example, a microprocessor may execute a timing loop beginning upon sending the test signal 134 and ending upon receiving the response signal 136. For example, an analog integrator may be initiated upon sending the test signal 134 and sampled by a sample and hold circuit coupled to an analog to digital converter, upon receiving the response signal 136. For example, a rotating encoding disk may be sensed upon sending the test signal 134 and upon receiving the response signal 136.

Figure 3:
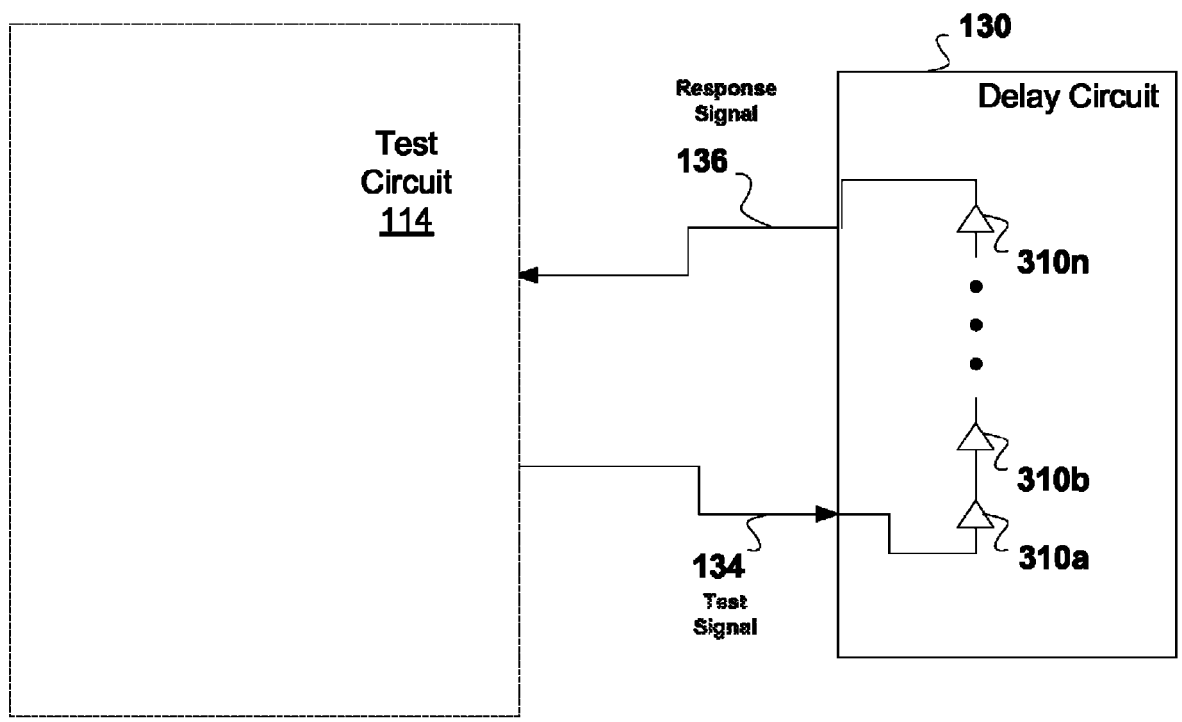
FIG. 3 is a block diagram illustrating details of an exemplary delay circuit of FIG. 1, according to various embodiments of the invention.

FIG. 3 is a block diagram illustrating details of the delay circuit 130 of FIG. 1, according to various embodiments of the invention. The delay circuit 130 includes one or more delay elements 310. The one or more delay elements 310 are illustrated in FIG. 3 as non-inverting delay elements 310a, 310b, . . . , 310n. In various embodiments, delay elements 310a, 310b, . . . , 310n may differ in their number and their type. The number of delay elements 310 may be configured to generate a desired propagation time of the test signal 134 through the one or more delay elements 310. The type of the one or more delay elements 310 may be selected according to the type of conditions (e.g., temperature, supply voltage, and the like) that the propagation time is intended to represent. In various embodiments, the types of delay elements 310 include digital devices, for example, gates, shift registers, inverters, and the like. In some embodiments, the type of delay elements 310 includes passive and/or analog devices, for example, delay lines, resistor inductor (RL) networks, resistor capacitor (RC) networks, and the like. In various embodiments, the type of delay elements 310 includes active analog components, including operational amplifiers, analog shift registers, charge coupled devices, and the like. In some embodiments, the type of delay elements includes a combination of digital devices, and/or analog devices.

Figure 4:
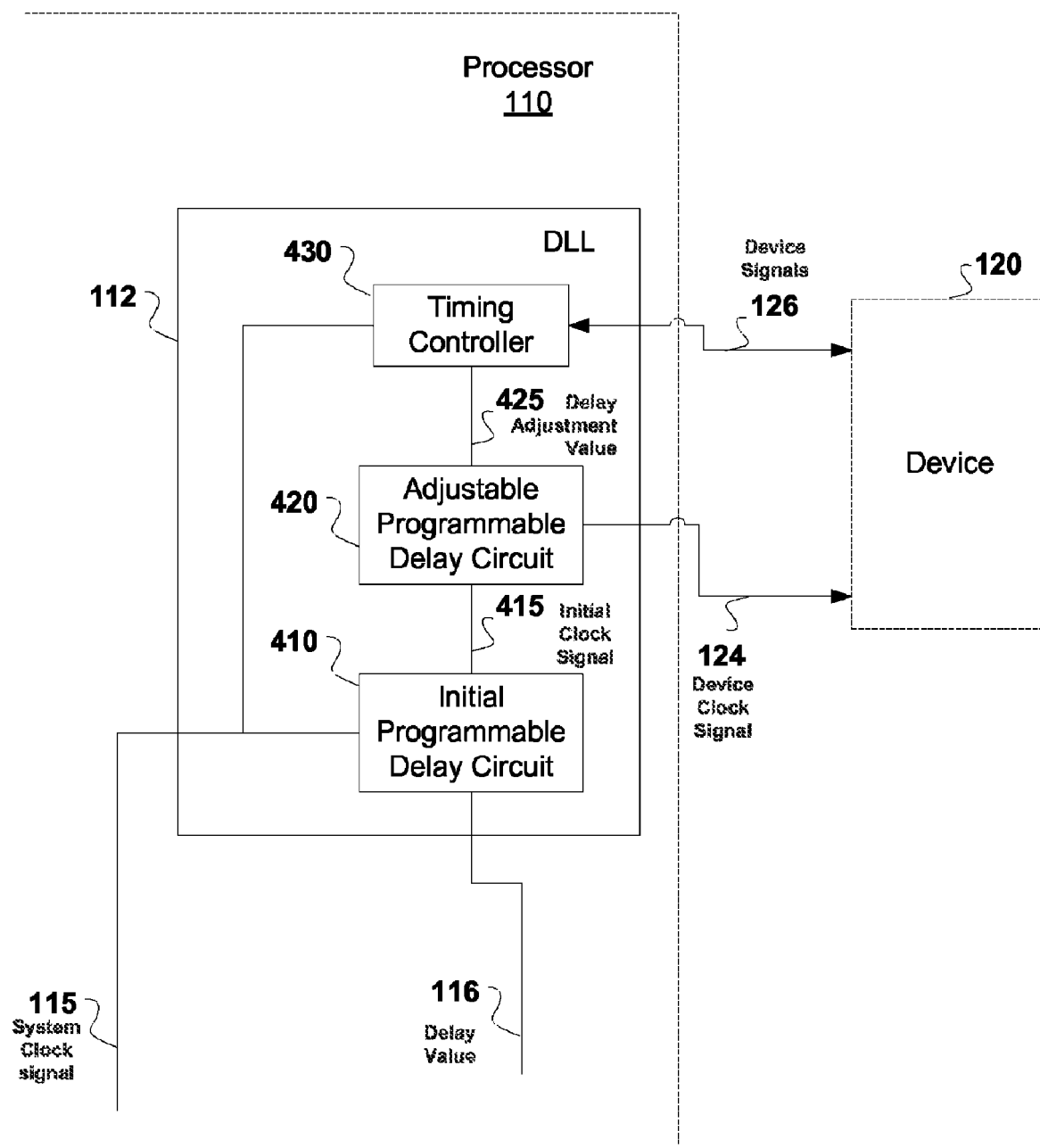
FIG. 4 is a block diagram illustrating details of an exemplary delay locked loop of FIG. 1, according to various embodiments of the invention.

FIG. 4 is a block diagram illustrating details of the DLL 112 of FIG. 1, according to various embodiments of the invention. The DLL 112 includes an initial programmable delay circuit 410, an adjustable programmable delay circuit 420, and a timing controller 430. The initial programmable delay circuit 410 is configured to receive the delay value 116 and the system clock signal 115, and an initial delay to a copy of the system clock signal 115 according to the delay value 116 and output an initial clock signal 415. The adjustable programmable delay circuit 420 is configured to receive the initial clock signal 415 and a delay adjustment value 425. The adjustable programmable delay circuit 420 may add an additional delay to the initial clock signal 415 according to the delay adjustment value 425 and output a device clock signal 124. Thus, in some embodiments, the device clock signal 124 is delayed relative to the system clock signal 115 by the sum of the initial delay and the additional delay. The additional delay is typically smaller than the initial delay. The device clock signal 124 is conveyed to the device 120 and used to facilitate the device signals 126 between the device 120 and the processor 110.

The timing controller 430 is configured to incrementally change the delay adjustment value 425 until a preferred delay time is found. An increment includes a positive value and a negative value (e.g., a decrement). At this preferred delay time, device signals 126 are synchronized with the (undelayed) system clock signal 115. The amount by which the delay adjustment value 425 is incremented or decremented is typically smaller than the delay value 116. As the delay adjustment value 425 is incremented or decremented, the delay between the device clock signal 124 and the system clock signal 115 is increased or decreased. When the timing controller 430 detects that the device signals 126 are synchronized with the system clock signal 115, the delay adjustment value 425 is no longer incremented or decremented.

In some embodiments, an initial value of the delay time may be the delay of the initial programmable delay circuit 410, according to the delay value 116, plus the additional delay of the adjustable programmable delay circuit 420 according to the delay adjustment value 425. In one exemplary embodiment, the delay adjustment value 425 is initially zero, the initial delay time may be the delay according to the delay value 116. The delay time may be increased from this initial value by incrementing the delay adjustment value 425 until the system clock 115 is synchronized with the device signals 126. In one exemplary embodiment, the delay adjustment value 425, and thus the delay time, are initially at a maximum value. In this embodiment, the delay time is then decreased by decrementing the delay adjustment value 425 from the maximum. This decrementation continues until the system clock 115 is synchronized with the device signals 126.

The timing controller 440 is configured to receive the system clock signal 115 and the device signals 126 and determine a quality of the timing synchronization between these signals. The timing controller may change the delay adjustment value 425 when this quality is low and to keep the delay adjustment value constant 425 constant when this quality is high. In various embodiments, the delay adjustment value 425 includes a digital or an analog signal (e.g., a voltage, a current, a frequency, bit pattern, or the like). Optionally, initial programmable delay circuit 410 is included in the adjustable programmable delay circuit 420 or the timing controller 430. Optionally, the adjustable programmable delay circuit 420 is a component of the timing controller 430.

Figure 5:
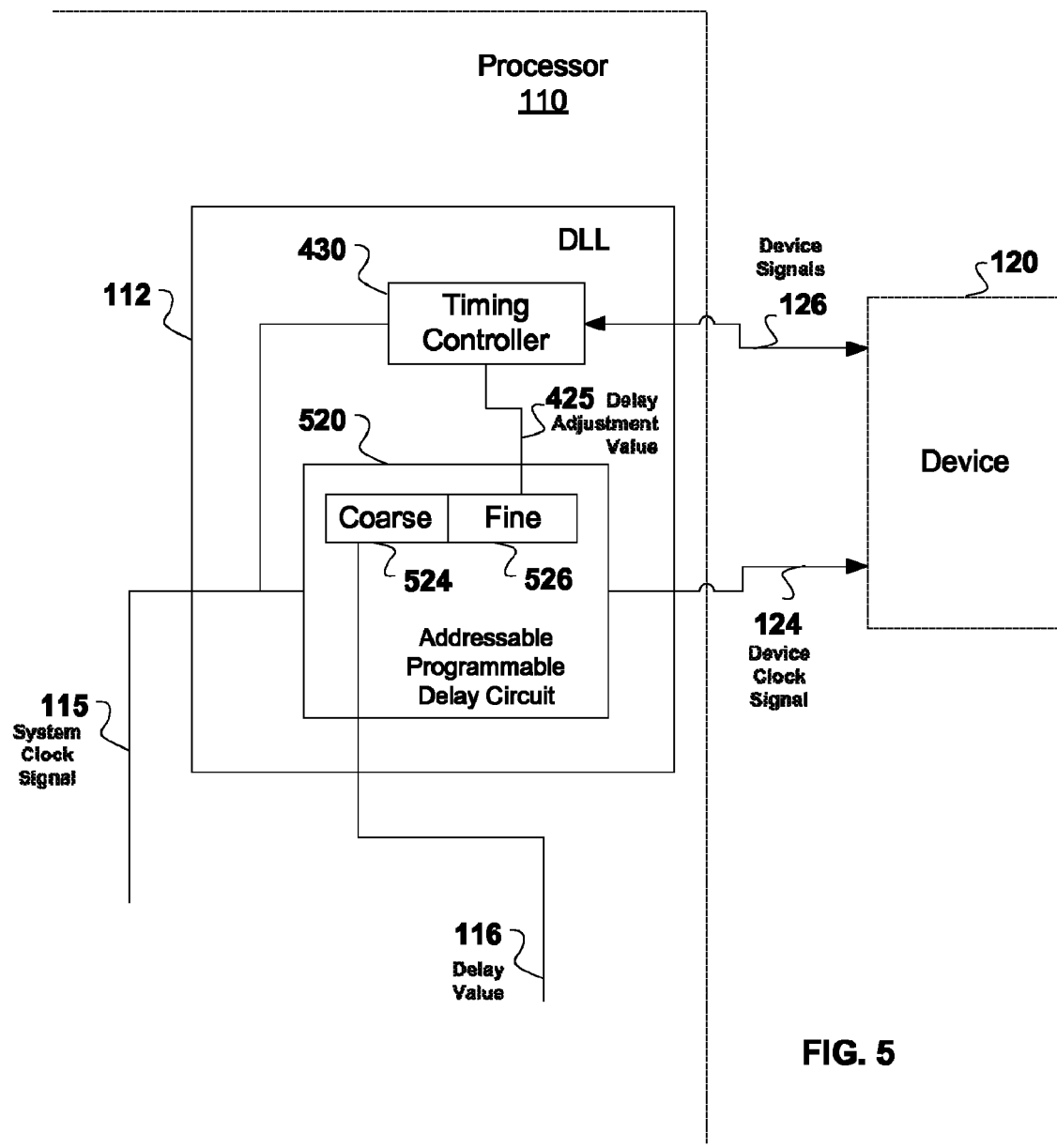
FIG. 5 is a block diagram illustrating details of an alternative embodiment of the delay lock loop of FIG. 1, according to various embodiments of the invention.

FIG. 5 is a block diagram illustrating details of alternative embodiments of the DLL 112 of FIG. 1. The embodiments illustrated by FIG. 5 differ from the embodiments illustrated by FIG. 4 in that the delay value 116 and the system clock signal 115 are applied to an addressable programmable delay circuit 520, instead of the initial programmable delay circuit 410, and initial programmable delay circuit 410 is omitted in FIG. 5. The addressable programmable delay circuit 520 includes a coarse delay register 524 configured to receive one or more bits and a fine delay register 526 configured to receive one or more bits. The addressable programmable delay circuit 520 may be configured to receive the delay value 116 in the coarse delay register 524 and the delay adjustment value 425 in the fine delay register 526. A delay time may include a sum of the coarse delay register 524 and the fine delay register 526. For example, the coarse delay register 524 may include high order bits for the delay time and the fine delay register may include low order bits for the delay time. The adjustable programmable delay 520 is configured to delay the system clock signal 115 according to the delay time.

In one embodiment, the fine delay register 526 is set to zero by the delay adjustment value 425 and an initial value for the delay time is determined by the value in the coarse delay register 524, e.g., the delay value 116. The delay time is then increased from the initial value by incrementing the fine delay register 526 using the delay adjustment value 425 from the timing controller 430, until the system clock 115 is synchronized with the device signals 126.

In one embodiment, the fine delay register 526 is set to a maximum value by the delay adjustment value 425 and an initial value for delay time may be a maximum delay time. The delay time is then decreased from the (maximum) initial value by decrementing the fine delay register 526 using the timing controller 430, until the system clock 115 is synchronized with the device signals 126.

Figure 6:
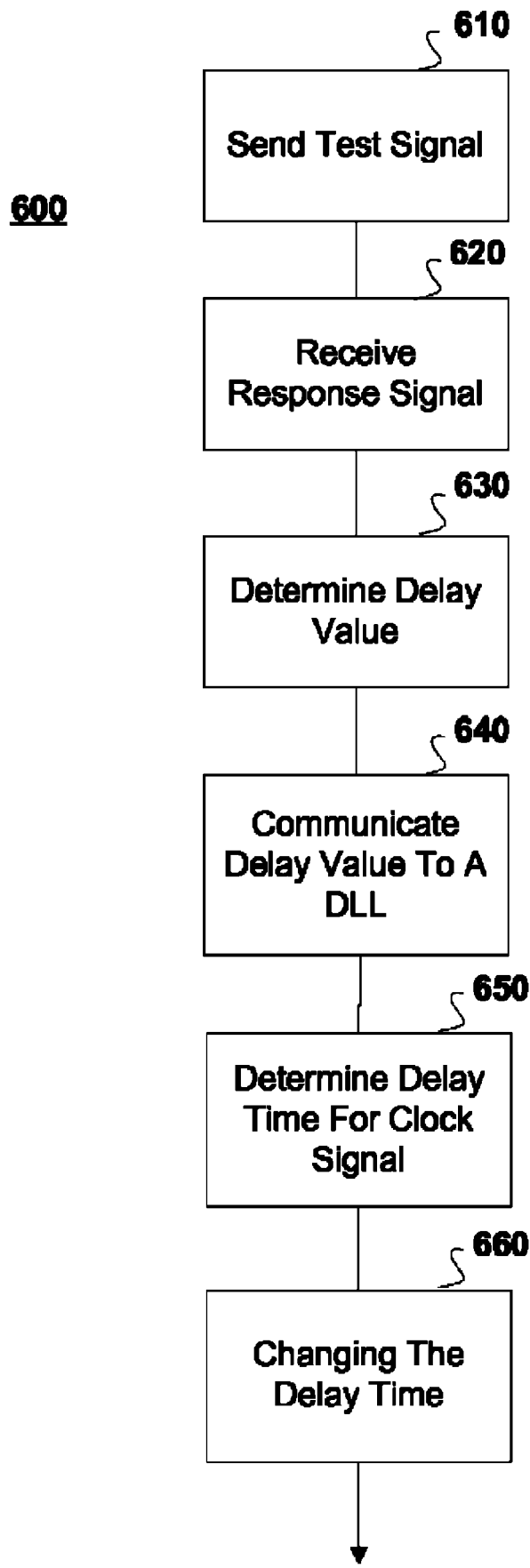
FIG. 6 is a flow diagram illustrating a delay lock loop adjustment method, according to various embodiments of the invention.

FIG. 6 is a flow diagram illustrating a delay lock loop adjustment method 600, according to various embodiments of the invention. The method 600 includes measuring a delay value representative of a propagation time through a delay circuit and using the delay to determine a delay time for facilitating synchronization between a clock signal and one or more device signals, by a DLL. This may be accomplished by measuring a propagation time between sending a test signal to a delay circuit and receiving a response signal from the delay circuit. The delay value is then determined according to the propagation time. The delay value is communicated to a programmable delay circuit to determine an initial value for a delay time between a clock signal for a processor and a device clock signal for a device. The delay time is changed, from this initial value, in the programmable delay circuit to synchronize the clock signal with the one or more device signals.

A step 610 includes sending a test signal, for example, the test signal 134 to a delay circuit, such as the delay circuit 130. A step 620 includes receiving a response signal, such as the response signal 136, from the delay circuit 130 in response to the test signal sent in step 610. In some embodiments, the test circuit 114 is used to perform step 610 and step 620.

A step 630 includes using the test circuit 114 to determine a delay value, for example, delay value 116, according to a time between sending the test signal 134 in step 610 and receiving the response signal 136 in step 620.

A step 640 includes communicating the delay value 116 determined in step 630 to a DLL, such as the DLL 112. The DLL 112 is configured to determine a synchronization between a clock signal, for example the system clock signal 105 and one or more device signals, such as device signals 126.

A step 650 includes determining an initial value for a delay time between the system clock signal 115 and the device clock signal 124, according to the delay value 116 communicated to the DLL 112 in step 650. In one embodiment, the delay time is determined in step 650 by the initial programmable delay circuit 410 and the adjustable programmable delay circuit 420. In one embodiment, the delay time is determined in step 650 by the addressable programmable delay circuit 520. It is anticipated that there are other ways in which the delay time may be determined from the delay value 116.

A step 660 includes changing the delay time determined in step 650 to provide the synchronization between the system clock signal 105 and the device signals 126. In one embodiment, the delay time is changed in step 660 by changing the delay adjustment value 425. For example, the timing controller 430 may be configured to change the delay adjustment value 425 by incrementing the delay adjustment value 425, decrementing the delay adjustment value 425, or applying a delta to the delay adjustment value 425. Optionally, the delay adjustment value 425 is changed by the timing controller 430 in step 660 according to a relation between the device signals 126 and the system clock 115. Typically, the changes made to the delay time in step 660 are applied in a incremental manner, each increment being smaller than the initial value of the delay time determined in step 650.

Figure 7:
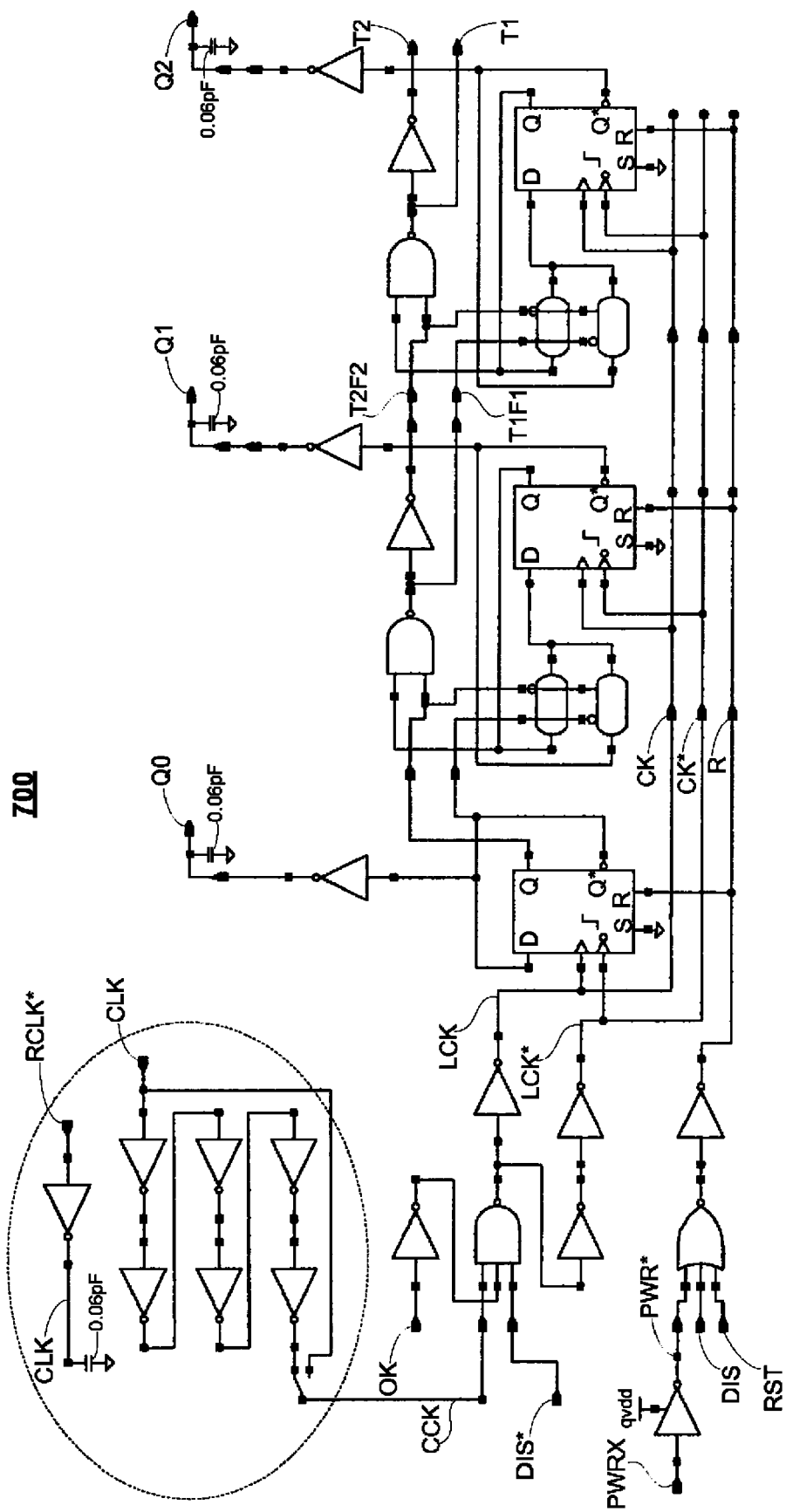
FIG. 7 is a circuit diagram illustrating details of an exemplary counter circuit, according to various embodiments of the invention.

FIG. 7 is a circuit diagram illustrating details of an exemplary counter circuit 700, according to various embodiments of the invention. The counter circuit 700 is configured to receive an input clock signal RCLK*, a reset signal RST, a disable signal DIS*, a response signal OK, and a power on reset signal PWRX. The counter circuit is further configured to output a count comprising count signals Q0, Q1, and Q2. The counter circuit may be reset by either the reset signal RST or the power on reset signal PWX. Upon reset, the counter circuit begins counting from zero using the input clock signal RCLK*. The current state of the counter may be output as the count on the count signals Q0, Q1, and Q2. The input clock RCLK* may be disabled by the disable signal DIS* or the response signal OK. The counter circuit is one example of an embodiment of the counter 210 of FIG. 2.

Figure 8:
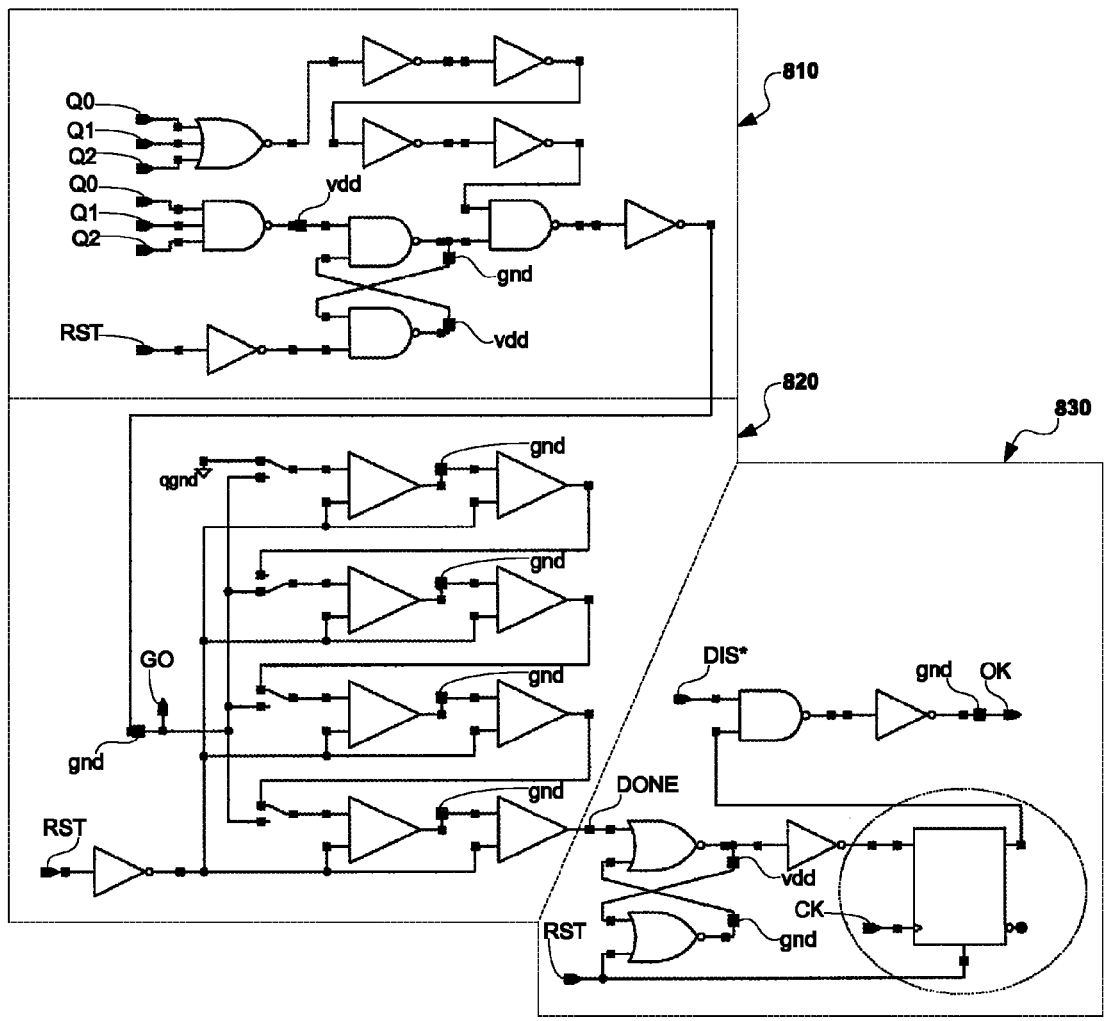
FIG. 8 is a circuit diagram illustrating details of an exemplary delay circuit, according to various embodiments of the invention.

FIG. 8 is a circuit diagram illustrating details of an exemplary delay module 800, according to various embodiments of the invention. The delay module 800 comprises an optional test control circuit 810, a delay line 820, and an optional response control circuit 830. The test control circuit 810 is configured to receive the reset signal RST and the count, and send a test signal GO to the delay line 820. The delay line 820 is configured to receive the test signal GO and output a response signal DONE to the response control circuit 830. The response control circuit 830 is configured to output a latch signal OK. The delay line 820 is one example of an embodiment of the delay circuit 130 of FIG. 1. The test control circuit 810 and the response control circuit 830 comprise one example of an embodiment of the controller 220 of FIG. 2.

Figure 9:
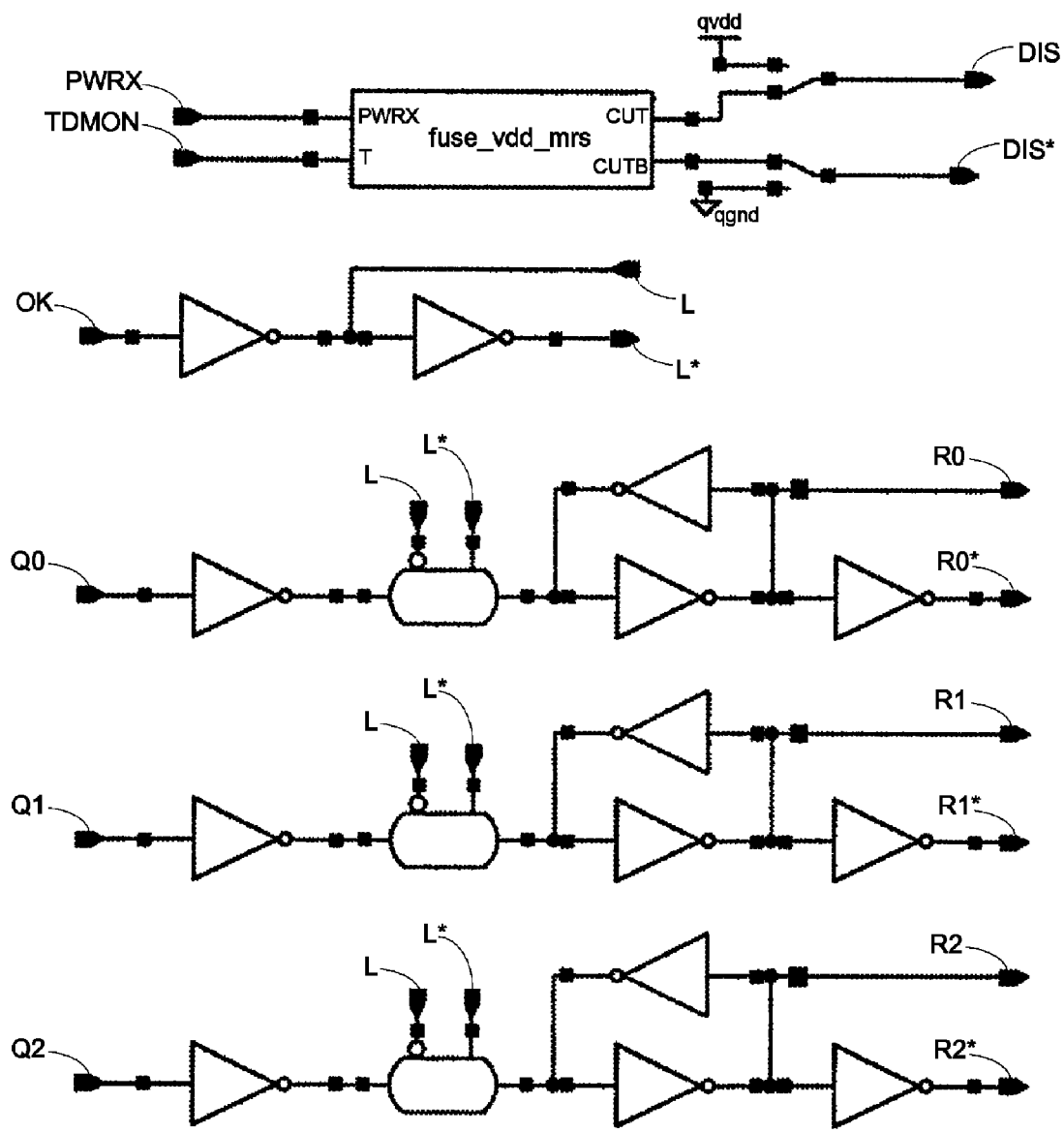
FIG. 9 is a circuit diagram illustrating details of an exemplary latch circuit, according to various embodiments of the invention.

FIG. 9 is a circuit diagram illustrating details of an exemplary register circuit 900, according to various embodiments of the invention. The register circuit 900 is configured to receive the latch signal OK and the count. The register circuit 900 is further configured to latch the count upon receiving the latch signal OK and a output delay comprising delay count signals R0, R0*, R1, R1*, R2, R2*. The register circuit 900 is one example of an embodiment of the register 230 and controller 220 of FIG. 2.

Figure 10A:
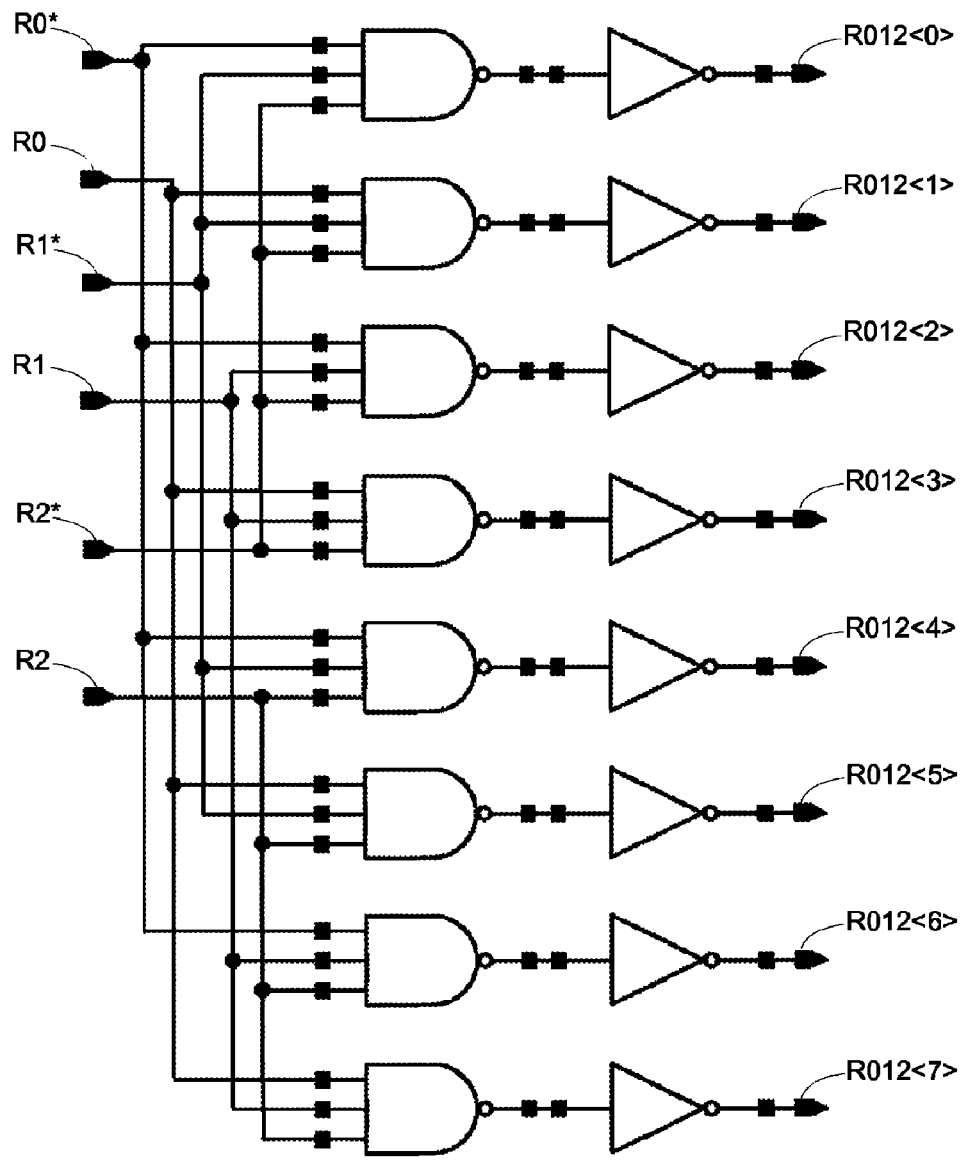
FIG. 10 is a circuit diagram illustrating details of an exemplary decoder circuit, according to various embodiments of the invention.
Figure 10B:
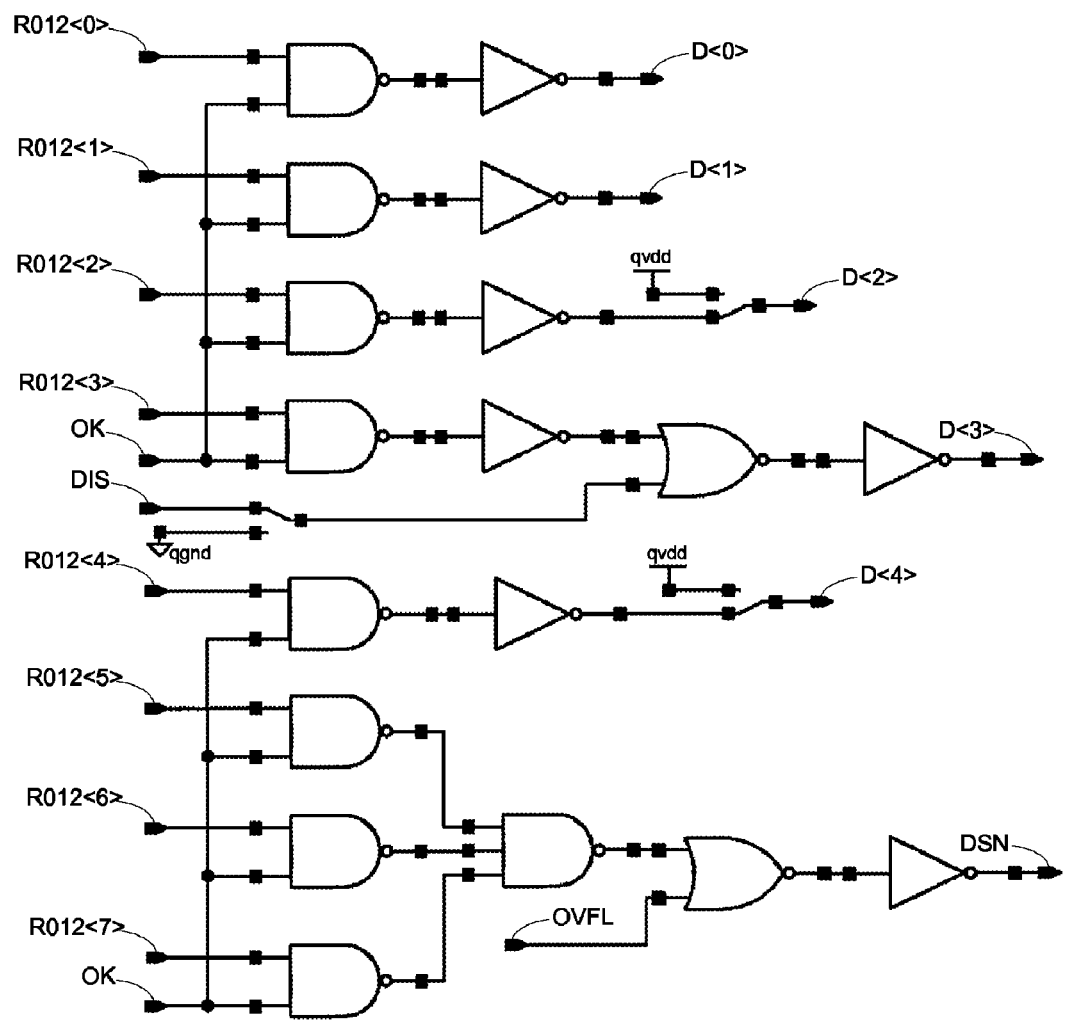

FIG. 10 is a circuit diagram illustrating details of an exemplary decoder circuit 1000, according to various embodiments of the invention. The decoder circuit 1000 is configured to receive the delay count signals R0, R0*, R1, R1*, R2, R2* and output a delay value, represented by delay value signals D<0>, D<1>, D<2>, D<3>, and D<4>. The decoder circuit 1000 includes one example of an embodiment of the conversion information 240 of FIG. 2. The delay value is one example of an embodiment of the delay value 116 of FIG. 1.

Figure 11A:
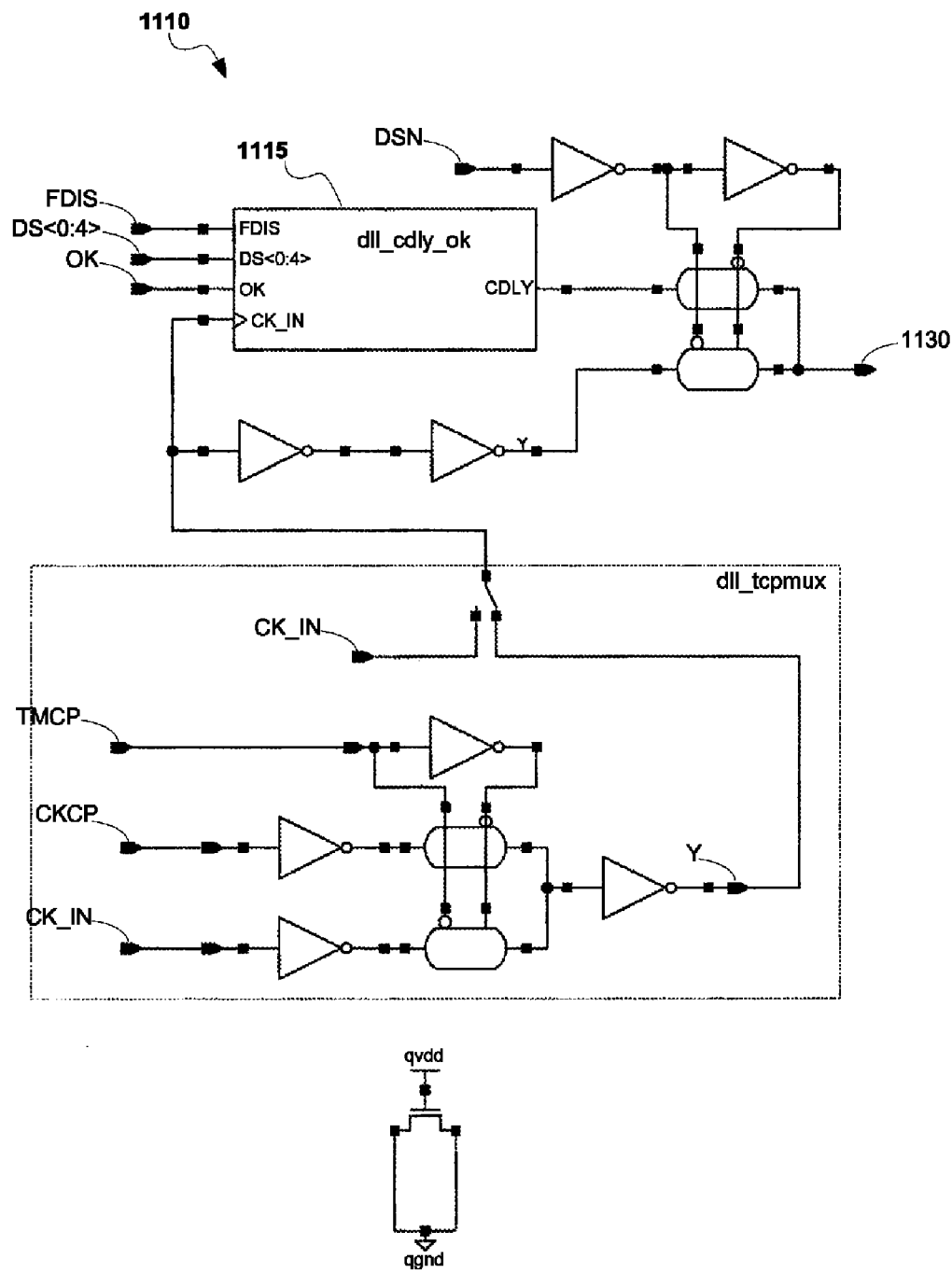
FIG. 11 is a circuit diagram illustrating details of an exemplary digital lock loop circuit, according to various embodiments of the invention.
Figure 11B:
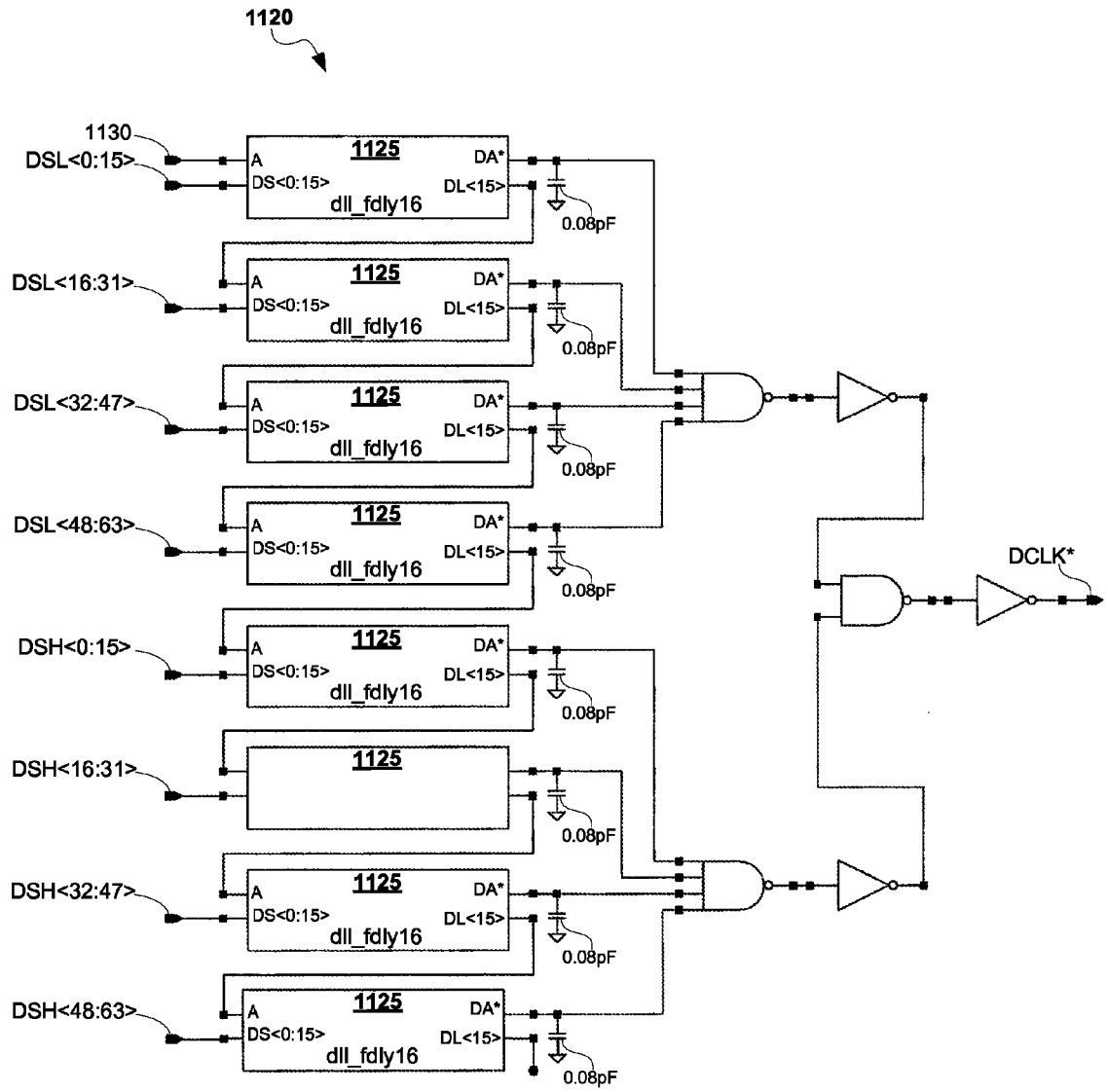

FIG. 11 is a circuit diagram illustrating details of an exemplary delay lock loop circuit 1100, according to various embodiments of the invention. The delay lock loop 1100 comprises a coarse delay circuit 1110 and a fine delay circuit 1120. The coarse delay circuit 1110 includes a programmable delay circuit 1115. The coarse delay circuit 110 is configured to receive a clock signal CK_IN and the delay value signals (DS<0,4>) and output an initial clock signal CDLY. The coarse delay circuit 1110 is one example of an embodiment of the initial programmable delay circuit 410 of FIG. 4. The initial clock signal CDLY is one example of an embodiment of the initial clock signal 415 of FIG. 4.

The fine delay circuit 1120 includes one or more programmable delay circuits 1125. The fine delay circuit 1120 is configured to receive the initial clock signal CDLY and delay adjustment value (DSL 0-63 and DSH 0-63) and output a device clock signal DCLK*. The delay adjustment value is one example of an embodiment of the delay adjustment value 425 of FIG. 4. The device clock signal DCLK* is one example of an embodiment of the device clock signal 124 of FIG. 4.

Figure 12:
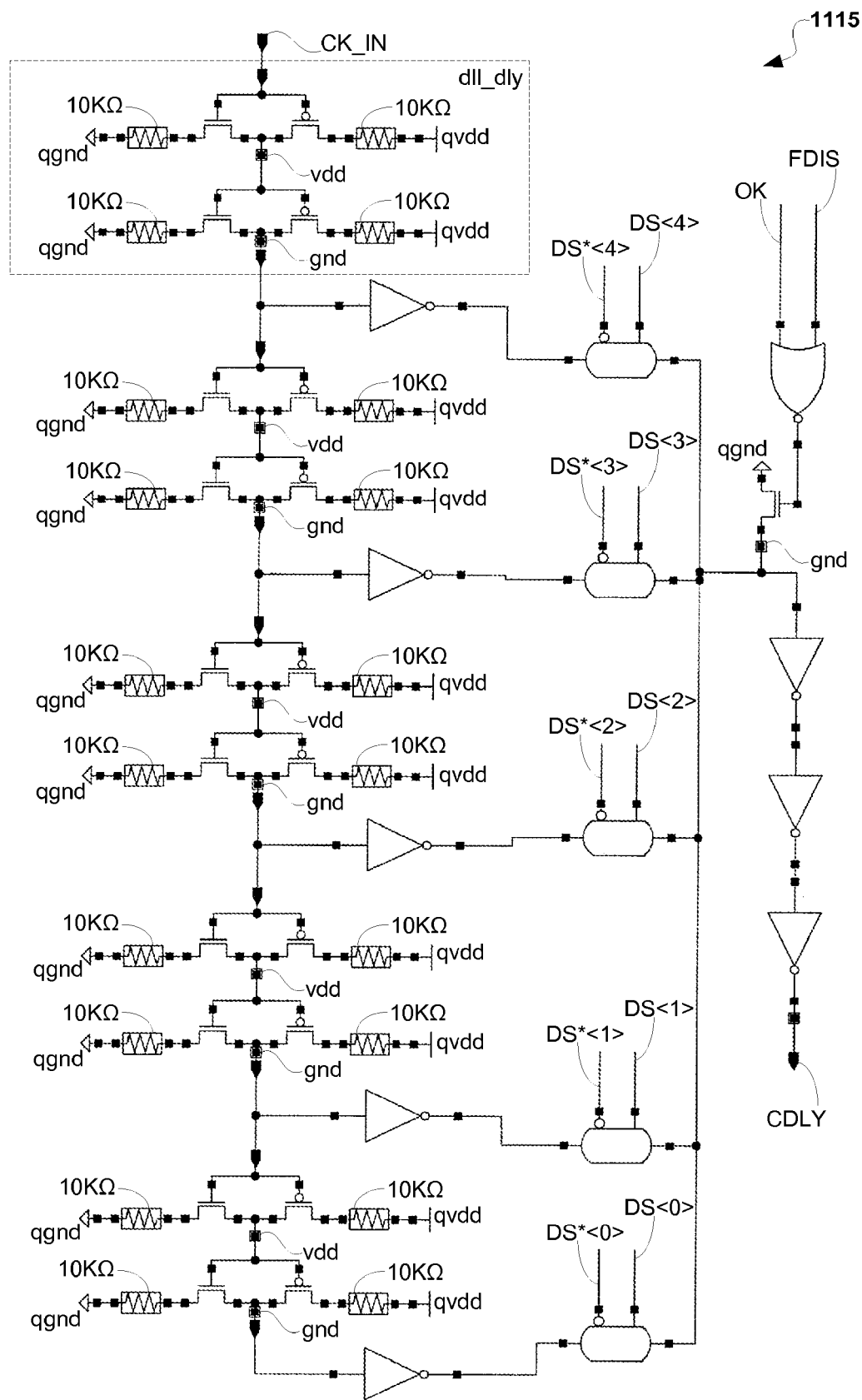
FIG. 12 is a circuit diagram illustrating details of a coarse delay circuit of FIG. 11, according to various embodiments of the invention.

FIG. 12 is a circuit diagram illustrating details of the programmable delay circuit 1115 of FIG. 11, according to various embodiments of the invention. The programmable delay circuit 1115 is configured to receive a clock signal CK_IN and the delay value and output an initial clock signal CDLY. The initial clock signal CDLY is delayed with respect to the clock signal CK_IN according to the delay value.

Figure 13:
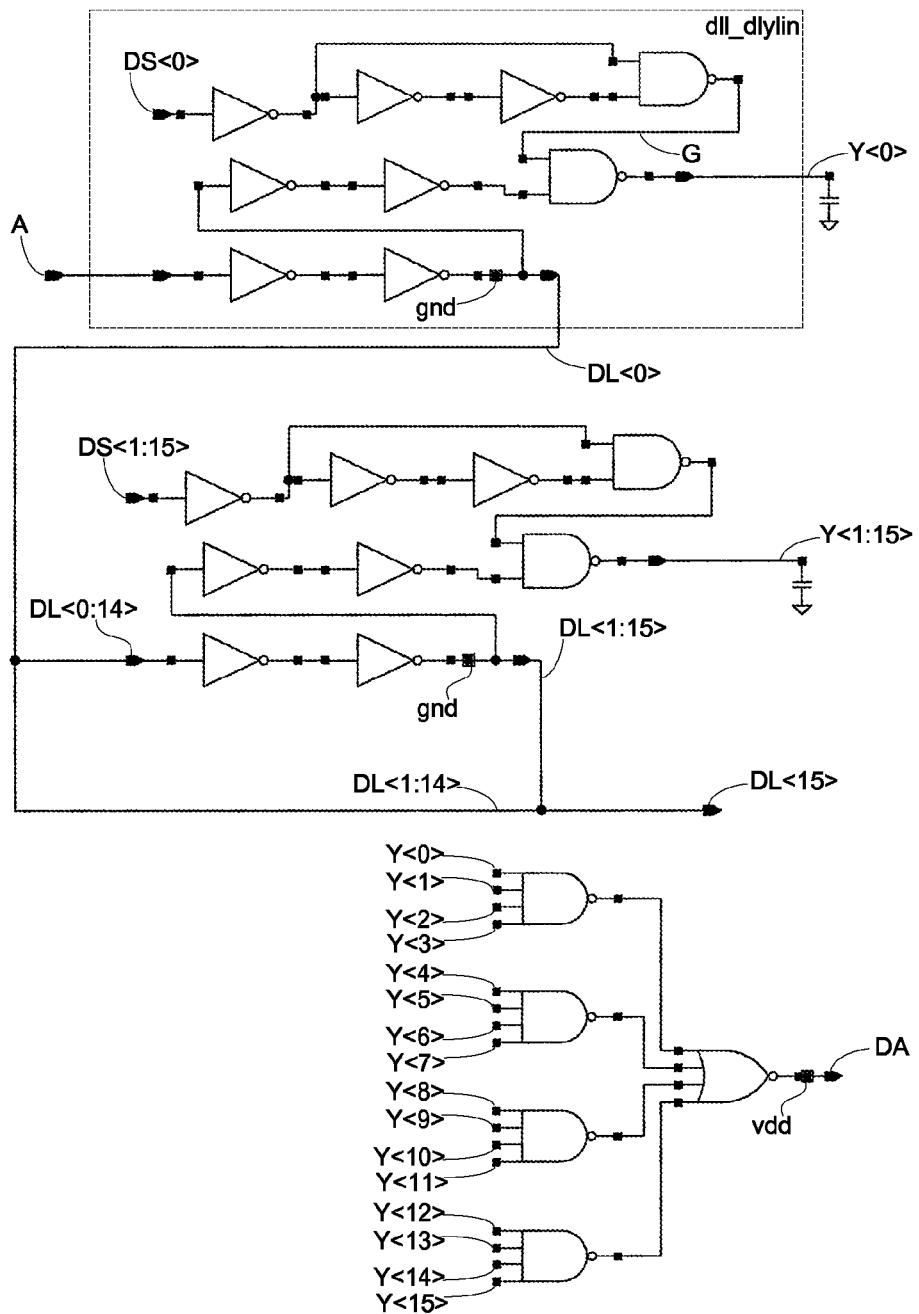
FIG. 13 is a circuit diagram illustrating details of a fine delay circuit of FIG. 11, according to various embodiments of the invention.

FIG. 13 is a circuit diagram illustrating details of the fine delay circuit 1125 of FIG. 11, according to various embodiments of the invention. The programmable delay circuit 1115 is configured to receive a clock signal A and data (DS<0:15> and DL>0:15) and output a carry out signal DA*. The carry out signal DA* is delayed with respect to the clock signal A, according to the delay value.

Several embodiments are specifically illustrated and/or described herein. However, it will be appreciated that modifications and variations are covered by the above teachings and within the scope of the appended claims without departing from the spirit and intended scope thereof. For example, the functions and features of several devices described herein may be combined into a single device. One of ordinary skill in the art will understand that there are other methods by which the propagation time between test signal 134 and response signal 136 may be used to determine an initial value of a delay between the system clock signal and the device clock signal. The examples provided herein are exemplary and are not meant to be exclusive.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

What is claimed is:

1. A processor to communicate with a device, comprising:
  a test circuit configured to send a test signal and to receive a response signal corresponding to the test signal, the test circuit including logic to determine a value indicating elapsed time from sending the test signal to receiving the response signal; and
  a delay locked loop configured to receive the value from the test circuit and to output a device clock signal having a delay from a system clock signal, the delay being initially determined by the value, the DLL is further configured receive at least one device signal from the device and to adjust the delay based on comparison of the at least one device signal with the system clock signal.

2. The processor of claim 1, wherein the test circuit further includes a register to store the value.

3. The processor of claim 1, wherein the logic includes a counter configured to receive a clock signal and to provide at least one count signal in response to the response signal being received, the clock signal being selected from the group consisting of the system clock signal and a derivative of the system clock signal.

4. The processor of claim 3, wherein the logic further includes a controller configured to determine the value based on the at least one count signal.

5. The processor of claim 3, wherein the test circuit further includes a lookup table for converting the at least one count signal to the value.

6. The processor of claim 1, wherein the delay locked loop includes:
an initial programmable delay circuit to receive the value and the system clock signal and to generate an initial clock signal;
an adjustable programmable delay circuit to receive the initial clock signal and a delay adjustment value and to output the device clock signal; and
a timing controller to receive the at least one device signal and the system clock signal and to adjust the delay adjustment value based on comparison of the device signal with the system clock signal.

7. The processor of claim 1, wherein the delay locked loop includes:
an addressable programmable delay circuit having a coarse delay register and a fine delay register, the course delay register to store the value and the fine delay register to receive a delay adjustment, the addressable programmable delay circuit being configured to delay the system clock signal by a delay time determined by the value and the delay adjustment so as to generate the device clock signal; and
a timing controller to receive the at least one device signal and the system clock signal and to generate a signal indicating the delay adjustment based on comparison of the device signal with the system clock signal.

8. The processor of claim 7, wherein the delay time is a sum of the value and the delay adjustment.

9. The processor of claim 1, wherein the test circuit sends the test signal over at least one first conductor coupled between the processor and the device.

10. The processor of claim 9, wherein the test circuit receives the response signal over the at least one first conductor.

11. The processor of claim 9, wherein the test circuit receives the response signal over at least one second conductor coupled between the processor and the device.

12. The processor of claim 1, further comprising a delay circuit to receive the test signal and to generate the response signal by delaying the test signal.

13. The processor of claim 1, further comprising a clock generator to generate the system clock.

14. The processor of claim 1, wherein the delay locked loop is configured to receive the system clock signal from a clock generator external to the processor.

15. A method performed by a processor coupled to a device, comprising:
sending a test signal;
receiving a response signal corresponding to the test signal;
determining a value indicating elapsed time from sending the test signal to receiving the response signal;
outputting a device clock signal having a delay from a system clock signal to at least one first conductor coupled between the processor and the device, the delay being initially determined by the value;
receiving at least one device signal from at least one second conductor coupled between the processor and the device; and
adjusting the delay based on comparison of the at least one device signal with the system clock signal.

16. The method of claim 15, wherein the determining comprises provide at least one count signal in response to the response signal being received.

17. The method of claim 16, wherein the determining further comprises applying a lookup table for converting the at least one count signal to the value.

18. The method of claim 15, wherein the sending comprises transmitting the test signal over at least one third conductor coupled between the processor and the device.

19. The method of claim 18, wherein receiving the response signal comprises receiving the response signal over the at least one third conductor.

20. The method of claim 18, wherein receiving the response signal comprises receiving the response signal over at least one fourth conductor.

* * * * *